United States Patent [19]

Plies

[11] Patent Number: 5,146,090
[45] Date of Patent: Sep. 8, 1992

[54] PARTICLE BEAM APPARATUS HAVING AN IMMERSION LENS ARRANGED IN AN INTERMEDIATE IMAGE OF THE BEAM

[75] Inventor: Erich Plies, Munich, Fed. Rep. of Germany

[73] Assignee: Siemens Aktiengesellschaft, Munich, Fed. Rep. of Germany

[21] Appl. No.: 691,238

[22] Filed: Apr. 25, 1991

[30] Foreign Application Priority Data

Jun. 11, 1990 [DE] Fed. Rep. of Germany ....... 4018690

[51] Int. Cl.$^5$ ............................................. H01J 37/04
[52] U.S. Cl. .................................... 250/310; 250/311;
250/396 ML; 250/397
[58] Field of Search ............... 250/306, 307, 310, 311,
250/397, 396 R, 396 ML

[56] References Cited

U.S. PATENT DOCUMENTS

| | | | |
|---|---|---|---|
| 4,675,524 | 6/1987 | Frosien et al. | 250/310 |
| 4,713,543 | 12/1987 | Feuerbaum et al. | 250/310 |
| 4,728,790 | 3/1988 | Plies | 250/305 |
| 4,766,314 | 8/1988 | Jung | 250/296 |
| 4,785,176 | 11/1988 | Frosien et al. | 250/396 ML |
| 4,831,266 | 5/1989 | Frosien et al. | 250/310 |
| 4,896,036 | 1/1990 | Rose et al. | 250/310 |

OTHER PUBLICATIONS

"High Performance Electron Optical Column for Testing ICs with Submicrometer Design Rules" by Erich Plies, Microelectronic Eng. 7, 1987, pp. 163–172.

Primary Examiner—Jack I. Berman
Assistant Examiner—James Beyer
Attorney, Agent, or Firm—Hill, Van Santen, Steadman & Simpson

[57] ABSTRACT

Particle beam apparatus for improving the spatial resolution of a conventional scanning electron microscope given low electron energies and adequately great working distances, an electrostatic immersion lens is arranged in the region of an intermediate image generated by a condenser unit. The immersion lens is composed of a beam-guiding tube that is at an anode potential and of a further tube electrode that is arranged and insulated in the column of the scanning electron microscope and is charged with a high positive potential. Since the tube electrode extends into the region of the pole piece gap of the objective lens, an electrical field that decelerates the electrons to the desired ultimate energy is built up at this location. Due to the retarding field overlaid on the focusing magnetic field of the objective lens, the lens has extremely low chromatic aberration and spherical aberration constants. Moreover, the influence of the Boersch effect is considerably diminished as a consequence of the high average kinetic energy of the primary electrons in the column.

19 Claims, 2 Drawing Sheets

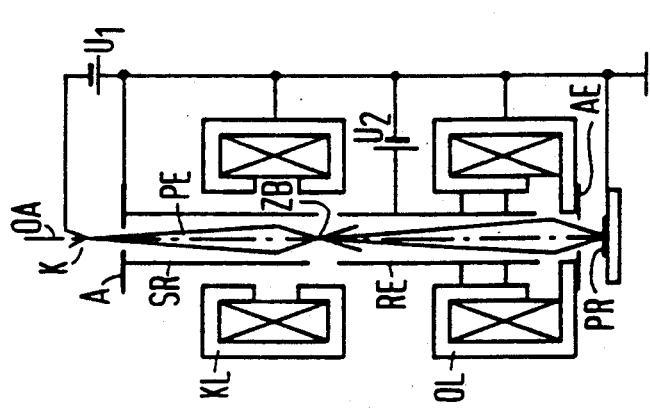
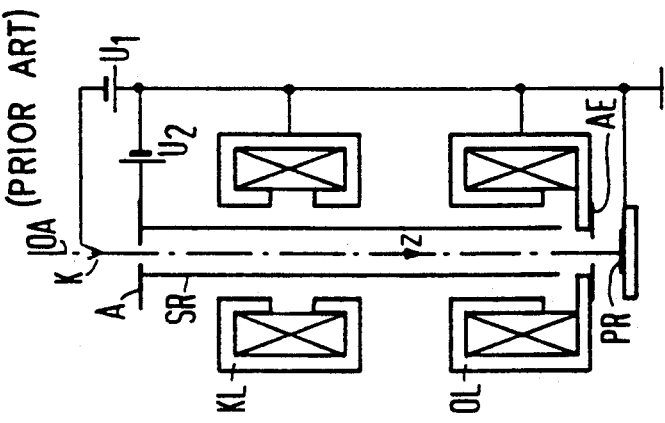
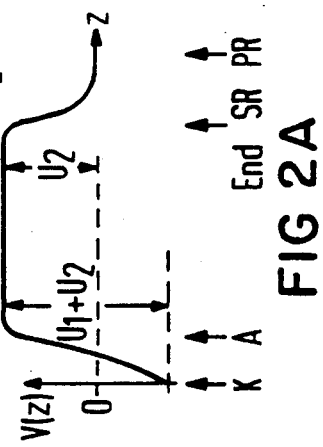
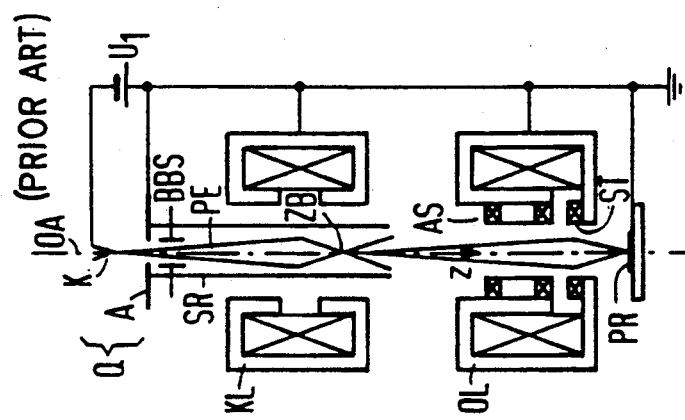

PARTICLE BEAM APPARATUS HAVING AN IMMERSION LENS ARRANGED IN AN INTERMEDIATE IMAGE OF THE BEAM

BACKGROUND OF THE INVENTION

The invention is directed to a particle beam apparatus and, in particular, to a particle beam apparatus having a particle beam generator, a first lens system for focusing the particle beam and a second lens system for imaging onto a specimen an intermediate image produced by the first lens system.

High resolution scanning electron microscopes have become necessary instruments in all areas of development and manufacture of microelectronic and optoelectronic components in order to visually evaluate submicrometer structures, in order to identify deviations from rated patterns and in order to acquire and evaluate topographical parameters such as heights, widths or angles of inclination. Conventional scanning electron microscopes, however, only achieve the required spatial resolution of fractions or a micrometer down to a few nanometers for small working distances and high accelerating voltages above approximately 20 kV. At these distances and voltages resist structures and integrated circuits are damaged by the high-energy electrons and non-conductive or poorly conductive specimens are charged.

The development of low-aberration condenser and objective lenses provided the possibility of designing scanning electron microscopes and electron beam measuring equipment that achieve the spatial resolution required for high-precision measurements even for low beam energies in the range of approximately 0.5 through 3 keV. In the lenses disclosed, for example, from U.S. Pat. Nos. 4,785,176, 4,831,266, and 4,728,790 or in Microelectronic Electronic Engineering, Vol. 7, Nos. 2 through 4 (1987) pages 163 through 172, an electrostatic regarding field overlaid on the focusing magnetic field to considerably reduce the lens aberrations given the same working distance is utilized.

In addition to lens aberrations, what is referred to as the Boersch effect also limits the spatial resolution. U.S. Pat. Nos. 4,713,543 and 4,675,524 disclose that electrons in the beam generator can be accelerated to a high energy of, for example, $E > 10$ keV in order to decelerate them to the desired, low end energy of, for example, $E < 1$ keV only immediately above the specimen.

U.S. Pat. No. 4,896,036 discloses a scanning electron microscope wherein the aberrations of an electrostatic detector objective lens are reduced using a corrector composed of a number of multiple elements.

All of the cited solutions that have been proposed require a re-design of the electron-optical column in order to improve the spatial resolution or at least require a considerable modification of the SEM electronics. As a result these low-aberration but complex lens systems cannot be used in conventional apparatus.

SUMMARY OF THE INVENTION

An object of the present invention is to provide a particle beam apparatus, particularly a scanning electron microscope, of the type initially cited that has a high spatial resolution even for low beam energies. This object is inventively achieved by a particle beam apparatus having a means for accelerating the particles from a first to a higher, second energy arranged in the intermediate image.

An advantage of the present invention is that the spatial resolution of a conventional scanning electron microscope can be noticeably improved for low beam energies and comparatively large working distances. The re-equipping for low-energy operation takes on a very simple format since only an additional tube electrode, a high-voltage power pack means as well as insulating mounts for arranging the tube electrode in the column of the scanning electron microscope are essentially required.

The following are advantageous developments of the present invention. A first electrostatic immersion lens is used as the means for accelerating the particles. The first immersion lens has an upper electrode and a lower electrode, whereby the upper electrode is at the potential of an anode of the particle beam generator.

The upper and lower electrodes each respectively have the shape of a hollow cylinder arranged concentrically relative to the beam axis of the first and second lens systems. A beam-guiding tube is connected to the anode as the upper electrode of the first immersion lens.

The second lens systems has an objective lens that generates a magnetic field that focuses the particles and has a second electrostatic immersion lens, whereby the second immersion lens is arranged such that the electrical retarding field thereof overlays on the focusing magnetic field. An upper electrode of the second immersion lens is at the potential of the lower electrode of the first immersion lens. The upper electrode of the second immersion lens has the shape of a hollow cylinder projecting into the objective lens. The lower electrode of the first immersion lens is identical to the upper electrode of the second immersion lens.

The particle beam apparatus further has means for deflecting the particle beam onto the specimen, and means for modulating the intensity of the particle beam. The particle beam apparatus can also have means for documenting the secondary particles triggered on the specimen or back-scattered from the specimen. The first lens system can have one or two condenser lenses. The means for accelerating the particles, such as the upper electrode and lower electrode of the first immersion lens can be arranged in the last intermediate image preceding the objective lens.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

FIGS. 1 and 2 schematically depict the structures of a conventional scanning electron microscope that is designed for low beam energies;

FIG. 1A depicts the shape of the ground-related potential V (z) for the FIG. 1 embodiment;

FIG. 2A depicts the shape of the potential V (z) for the FIG. 2 embodiment;

FIG. 3 schematically depicts an exemplary embodiment of a scanning electron microscope of the present invention;

FIG. 3A depicts the shape of the potential V (z) for the FIG. 3 embodiment;

DESCRIPTION OF THE PREFERRED EMBODIMENT

Figure 4:
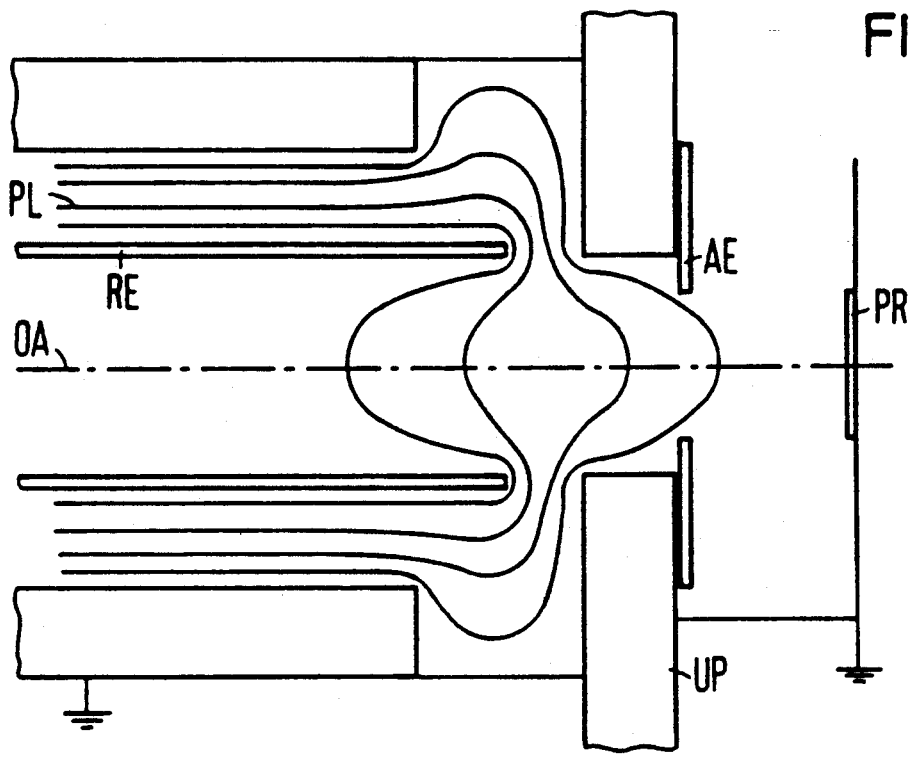
FIG. 4 depicts the distribution of electrical potential within the objective lens of the scanning electron microscope of the present invention.

As schematically shown in FIG. 1, a conventional scanning electron microscope usually comprises an electron beam generator Q, a condenser unit KL composed of one or two pole piece lenses and an objective lens OL that images the intermediate image ZB of the virtual electron source that is produced by the condenser unit KL onto the specimen PR demagnified. Further, the electron-optical column also contains a beam blanking system BBS, a deflection unit AS for positioning the electron beam on the specimen PR as well as a stigmator ST that corrects for astigmatism. The detectors (not shown) for documenting the secondary electrons triggered on the specimen PR and the primary electrons back-scattered from the specimen PR are usually arranged laterally below or, respectively, above the objective lens OL.

An asymmetrical magnetic lens is used as objective lens OL, the pole pieces thereof concentrating the magnetic flux generated by the excitation coil onto a small spatial region around the optical axis OA (z-axis), whereby the magnetic field that is rotationally symmetrical around this axis OA reaches its maximum strength in the pole piece gap.

Since both the specimen PR as well as the objective lens OL, the condenser unit KL, the anode A and the beam guiding tube SR that extends into the condenser unit KL are at ground potential, the electrons PE are already accelerated to the desired ultimate energy $E=e\ U_1$ in the beam generator Q (see FIG. 1A that shows the curve of the potential V(z) referenced to the apparatus ground on the beam axis and the position of the cathode K, of the anode A and of the specimen PR). The elementary charge is referenced e and the difference in potential built up between the cathode K and the anode A is referenced $U_1$.

Given low accelerating voltages $U_1 < 3$ kV, the spatial resolution that is proportional to the beam diameter d on the specimen PR is essentially limited by the electron-to-electron interaction (Boersch effect) that opposes the focusing and by the axial chromatic aberration of the objective lens OL. The beam diameter d is approximately calculated as $$d=(d_C^2+d_F^2)^{\frac{1}{2}} \quad (1)$$

where $d_C$ is the geometrical-optical probe diameter expanded by the Coulomb repulsion of the electrons in the beam path between the cathode K and the specimen PR (lateral Boersch effect) and $d_F$ is the diameter of the circle of least confusion produced by the chromatic aberration of the objective lens OL. As may be seen from equation (2), the quantity $d_F$ is dependent on the beam aperture $\alpha$, on the chromatic aberration coefficient $C_F$ of the objective lens OL, on the electron energy $E=e\ U_1$ and on the width $e\Delta U$ of the energy distribution of the electrons.

$$d_F=C_F\alpha\Delta U/U_1 \quad (2)$$

Since the chromatic aberration constant $C_F$ is proportional to the focal distance f of the lens, the beam diameter d and, thus, the spatial resolution can be improved by reducing the focal distance. Narrow limits are placed on this, however, since the specimen PR must then be arranged extremely close and below the objective lens OL, i.e. in the magnetic field thereof. Moreover, larger specimens can then no longer be scanned in an inclined orientation. A further improvement in the spatial resolution is therefore only possible by a reduction of the Boersch effect (suppression of the energetic Boersch effect that influences the energy width $e\Delta U$ and of the lateral Boersch effect that effects an expansion of the beam) and by a reduction of the aberrations of the imaging system.

In the scanning electron microscope shown in FIG. 2, these requirements are taken into consideration in that the anode A is charged with a high positive potential with reference to ground and in that the beam guiding tube SR that is conductively connected to the anode A is lengthened into the region of the pole piece gap of the objective lens OL. Since the electrons pass through nearly the entire column of the scanning electron microscope with a high energy $E=e\ (U_1+U_2)$ of, for example, $E=10$ keV and are not decelerated to the desired ultimate energy of, for example, $E=e\ U_1=1$ keV until within the objective lens OL in the electrical field built up between the beam guiding tube SR and the lower pole piece at ground potential, the influence of the Boersch effect is considerably diminished. Furthermore, as a consequence of the electrical retardation field overlaid on the focusing magnetic field, the objective lens has noticeably smaller chromatic aberration and spherical aberration constants than does the purely magnetic objective lens of the scanning electron microscope of FIG. 1. The electrode AE that is under the objective lens OL and that is also at ground potential serves the purpose of shielding the specimen PR.

Since the beam-guiding tube SR lies at a high voltage $U_2$ (see FIG. 2A that also shows the curve of potential V(z) referenced to apparatus ground or, respectively, the curve of potential $\Phi(z)$ referenced to the cathode on the beam axis and the position of the end of the beam tube), considerable modifications of the SEM electronics, particularly of the components for driving the beam blanking system that is also charged with the accelerating potential, are required in this scanning electron microscope.

In order to improve the spatial resolution of a conventional scanning electron microscope for low energies E <3 keV, the present invention provides that an electrostatic immersion lens be arranged at the location of the intermediate image ZB generated by the condenser unit KL. In a conventional scanning electron microscope, the position of this last intermediate image ZB preceding the objective lens OL is usually retained with a double condenser. As schematically shown in FIG. 3, the immersion lens that accelerates the primary electrons PE is composed of the beam-guiding tube SR that is already present and that can be potentially lengthened or shortened as well as of an additional tube electrode RE that is arranged and insulated in the column and that is charged with a positive potential of, for example, $U_2=10$ kV. Additional aberrations are not caused by the accelerating field built up between the tube ends of the electrodes SR and RE since the lens effect thereof is optically eliminated (the intermediate image ZB lies in the immersion lens). As FIG. 3A shows, the electrons PE have in the column a comparatively high average kinetic energy, and as a result the influence of the Boersch effect on the probe diameter is correspondingly diminished. Moreover, due to the electrostatic retarding field overlaid on the focusing magnetic field, the objective lens OL has extremely low chromatic aberration and spherical aberration constants. The retarding field is thereby generated by means of the immersion lens formed of the tube electrode RE and the lower pole piece UP that is at ground potential (see FIG. 4). A shielding electrode AE is again provided under the objective lens OL in order to prevent the passage of the retarding field, indicated by potential lines PL in FIG. 4, onto the specimen PR.

Figure 5:
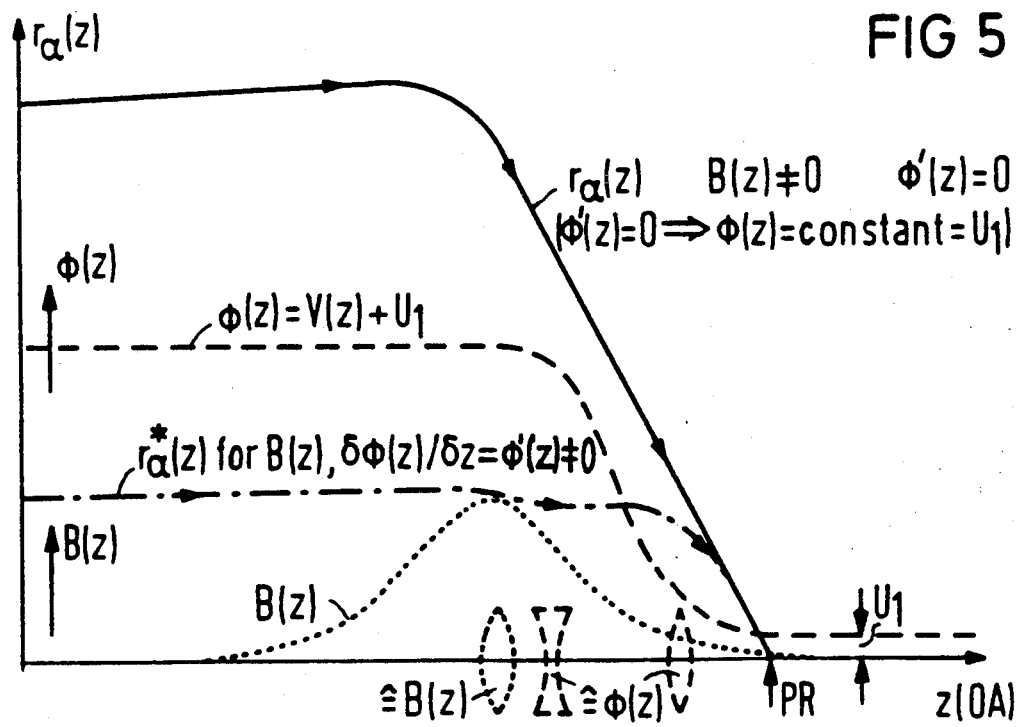
FIG. 5 is a graph showing the calculated electron paths $r_a(z)$ and $r_a^*(z)$ within a purely magnetic or, respectively, an electrostatic-magnetic objective lens, the two paths intersect the optical axis OA (z-axis) in the specimen plane and have the same slope at that point.

As results of a simulation calculation shown in FIG. 5 demonstrate, the axial electron path $r_\alpha(z)$ (solid line) in an objective lens that generates a purely magnetic field B(z) (dotted line) proceeds extremely far outside the optical axis, whereas the electrons emanating from the same position of the intermediate image penetrate the electrostatic-magnetic lens in the region close to the axis (dot-dash line $r_\alpha^*(z)$). Consequently, the chromatic aberration and spherical aberration constants of this latter lens type are also correspondingly lower since these are respectively calculated from integrals over polynomials of $r_\alpha^*(z)$ and the derivations thereof of degrees 2 and 4. It may also be seen with reference to FIG. 5 that the focusing of the electrons in the electrostatic-magnetic field (for $B(z) \neq 0$, $\delta\Phi(z)/\delta z = \Phi(z) \neq 0$, $\Phi(z) = V(z) + U_1$) is more complicated than in the purely magnetic field (for $B(z) \neq 0$, $\delta\Phi(z)/\delta z = 0$). Since the immersion lens that generates the retarding field can be equivalently subdivided into a defocusing and a focusing part and since these are preferably arranged in the beam path following the magnetic lens, the electrons are first deflected in the magnetic field in the direction of the optical axis (z-axis) and are slightly refracted away from the optical axis in the defocusing part, in order to be subsequently focused onto the axis by the convergent electrostatic part. For the same slope $\delta r_\alpha(z)/\delta z$ or, respectively, $\delta r_\alpha(z)/\delta(z)$ in the plane of the specimen PR, the quantity $r_\alpha^*(z)$ is always smaller than $r_\alpha(z)$ in the purely magnetic lens, so that the aberration integrals for the chromatic aberration and spherical aberration constants are also correspondingly smaller.

The present invention, of course, is not limited to the exemplary embodiments that have been set forth. Thus, it is possible without further procedures or apparatus to use the immersion lens composed of an upper and lower tube electrode in other particle beam apparatus as well, particularly in an ion beam apparatus, for accelerating the particles from a first to a higher, second energy.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A particle beam apparatus comprising: a particle beam generator for producing a beam of particles, a first lens system for focusing the particle beam and a second lens system for imaging an intermediate image of the particle beam produced by the first lens system onto a specimen, and a first immersion lens for accelerating the particles from a first energy level to a higher, second energy level, the first immersion lens for accelerating arranged in the intermediate image.

2. The particle beam apparatus according to claim 1, wherein said first immersion lens comprises an upper electrode and a lower electrode, said upper electrode being at a potential of an anode of said particle beam generator.

3. The particle beam apparatus according to claim 2, wherein said upper electrode and said lower electrode each respectively have the shape of a hollow cylinder arranged concentrically relative to the optical axis of said first lens system and of said second lens system.

4. The particle beam apparatus according to claim 2, wherein said upper electrode of the first immersion lens is a beam-guiding tube connected to the anode.

5. The particle beam apparatus according claim 1, wherein the second lens system has an objective lens that generates a magnetic field that focuses the particles and has a second immersion lens, said second immersion lens being arranged such that the electrical retarding field thereof overlays on the focusing magnetic field.

6. The particle beam apparatus according claim 2, wherein the second lens system has an objective lens that generates a magnetic field that focuses the particles and has a second immersion lens, said second immersion lens being arranged such that the electrical retarding field thereof overlays on the focusing magnetic field, and wherein said second immersion lens has an upper electrode that is at a potential of the lower electrode of said first immersion lens.

7. The particle beam apparatus according to claim 2, wherein the second lens system has an objective lens that generates a magnetic field that focuses the particles and has a second immersion lens, said second immersion lens being arranged such that the electrical retarding field thereof overlays on the focusing magnetic field, and wherein said second immersion lens has an upper electrode that has the shape of a hollow cylinder and projects into said objective lens.

8. The particle beam apparatus according to claim 2, wherein the second lens system has an objective lens that generates a magnetic field that focuses the particles and has a second immersion lens, said second immersion lens being arranged such that the electrical retarding field thereof overlays on the focusing magnetic field, and the lower electrode of said first immersion lens also being an upper electrode of said second immersion lens.

9. The particle beam apparatus according to claim 1, wherein the particle beam apparatus further has a means for deflecting the particle beam onto the specimen.

10. The particle beam apparatus according to claim 1, wherein the particle beam apparatus further has a means for modulating the intensity of the particle beam.

11. The particle beam apparatus according to claim 1, wherein the particle beam apparatus further has means for documenting the secondary particles triggered on the specimen.

12. The particle beam apparatus according to claim 1, wherein said first lens system has one condenser lens.

13. The particle beam apparatus according to claim 1, wherein said first immersion lens for accelerating the particles is arranged in the last intermediate image preceding an objective lens.

14. The particle beam apparatus according to claim 1, wherein said particle beam apparatus further has means for documenting the secondary particles back-scattered from the specimen.

15. The particle beam apparatus according to claim 1, wherein said first lens system has two condenser lenses.

16. A particle beam apparatus comprising: a particle beam generator for producing a beam of particles; a first lens system for focusing the particle beam and a second lens system for imaging an intermediate image of the particle beam produced by the first lens system onto a specimen; a first immersion lens for accelerating the particles from a first energy level to a higher, second energy level, the first immersion lens arranged in the intermediate image and having an upper electrode and a lower electrode, said upper electrode being at a potential of an anode of said particle beam generator; and the second lens system having an objective lens that generates a magnetic field that focuses the particles and a second immersion lens, said second immersion lens being arranged such that the electrical retarding field thereof overlays on the focusing magnetic field.

17. The particle beam apparatus according claim 16, wherein the second lens system has an objective lens that generates a magnetic field that focuses the particles and has a second immersion lens, said second immersion lens being arranged such that the electrical retarding field thereof overlays on the focusing magnetic field, and wherein said second immersion lens has an upper electrode that is at a potential of the lower electrode of said first immersion lens.

18. A particle beam apparatus comprising: a particle beam generator for producing a beam of particles; a first lens system for focusing the particle beam and a second lens system for imaging an intermediate image of the particle beam produced by the first lens system onto a specimen; a first immersion lens for accelerating the particles from a first energy level to a higher, second energy level, the first immersion lens arranged in the intermediate image and having an upper electrode and a lower electrode, said upper electrode being at a potential of an anode of said particle beam generator; said upper electrode and said lower electrode each respectively having the shape of a hollow cylinder arranged concentrically relative to an axis of the particle beam axis of said first lens system and of said second lens system; said upper electrode of the first immersion lens being a beam-guiding tube connected to the anode; the second lens system having an objective lens that generates a magnetic field that focuses the particles and a second immersion lens, said second immersion lens being arranged such that the electrical retarding field thereof overlays on the focusing magnetic field; the second lens system having an upper electrode that has the shape of a hollow cylinder and projecting into said objective lens and the lower electrode of said first immersion lens also being the upper electrode of said second immersion lens.

19. The particle beam apparatus according claim 18, wherein the upper electrode of said second immersion lens is at a potential of the lower electrode of said first immersion lens.

* * * * *